(12) United States Patent
Licht et al.

(10) Patent No.: US 9,951,978 B2
(45) Date of Patent: Apr. 24, 2018

(54) DEVICE FOR HEATING AND/OR COOLING A CHAMBER

(71) Applicant: PR Germany GmbH, Cologne (DE)

(72) Inventors: Michael Licht, Numbrecht (DE); Peter Reinecke, Numbrecht (DE)

(73) Assignee: PR Germany GmbH, Cologne (DE)

( * ) Notice: Subject to any disclaimer, the term of this patent is extended or adjusted under 35 U.S.C. 154(b) by 68 days.

(21) Appl. No.: 14/411,038

(22) PCT Filed: May 15, 2013

(86) PCT No.: PCT/EP2013/059987
§ 371 (c)(1),
(2) Date: Dec. 23, 2014

(87) PCT Pub. No.: WO2013/174685
PCT Pub. Date: Nov. 28, 2013

(65) Prior Publication Data
US 2015/0285540 A1    Oct. 8, 2015

(30) Foreign Application Priority Data

May 21, 2012 (DE) ........................ 10 2012 208 406

(51) Int. Cl.
*F25B 21/00* (2006.01)
*F25B 21/04* (2006.01)
(Continued)

(52) U.S. Cl.
CPC ............ *F25B 21/04* (2013.01); *E06B 3/6715* (2013.01); *F24F 5/0042* (2013.01); *F24F 13/18* (2013.01);
(Continued)

(58) Field of Classification Search
CPC .......... F25B 21/00; F25B 21/02; F25B 21/04; F25B 2321/02; F25B 2321/021;
(Continued)

(56) References Cited

U.S. PATENT DOCUMENTS 3,064,110 A    11/1962    Vogler
3,087,309 A    4/1963    Toulmin
(Continued)

FOREIGN PATENT DOCUMENTS

CN    2537940 B1    2/2003
CN    1228864 B1    8/2004
(Continued)

OTHER PUBLICATIONS (2008) Knovel Critical Tables "Properties of Elements" (2nd Edition). Knovel. Online version available at: http://app.knovel.com/hotlink/toc/id:kpKCTE000X/knovel-critical-tables/knovel-critical-tables.*

(Continued)

*Primary Examiner* — Frantz Jules
*Assistant Examiner* — Erik Mendoza-Wilkenfel
(74) *Attorney, Agent, or Firm* — Hodgson Russ LLP

(57) ABSTRACT

The invention relates to a device for heating and/or cooling a chamber (9). The device comprises at least one frame (4), at least one first light passage device (1) and at least one second light passage device (2). The fast light passage device (1) and the second light passage device (2) are arranged on the frame (4). Furthermore, at least one first intermediate chamber (3) is formed between the first light passage device (1) and the second light passage device (2). At least one thermally conductive medium is arranged in the first intermediate chamber (3). At least one heating and/or cooling element (5) is arranged on the frame (4) such that it is in contact with the thermally conductive medium arranged
(Continued)

in the intermediate chamber (3), the device having at least one current supply unit (8) which is powered by solar energy and which is connected to the heating and/or cooling element (5).

31 Claims, 4 Drawing Sheets

(51) Int. Cl.
| | |
|---|---|
| G02F 1/133 | (2006.01) |
| F24J 2/00 | (2014.01) |
| E06B 7/12 | (2006.01) |
| H05B 3/84 | (2006.01) |
| F24F 1/02 | (2011.01) |
| F24F 5/00 | (2006.01) |
| F25B 27/00 | (2006.01) |
| H01L 31/048 | (2014.01) |
| F24F 13/18 | (2006.01) |
| E06B 3/67 | (2006.01) |

(52) U.S. Cl.
CPC ........ *F25B 27/002* (2013.01); *H01L 31/0488* (2013.01); *F24F 2005/0067* (2013.01); *Y02E 10/50* (2013.01)

(58) Field of Classification Search
CPC ........ F25B 2321/0212; F25B 2321/023; F25B 2321/025; F25B 2321/0251; F25D 21/04; F25D 2321/02; F25D 2321/021; F25D 2321/023; G02F 1/133; F24J 2/00; E06B 2009/586; H05B 3/84; F24F 1/027; F24F 5/075; F24F 7/013; F24F 2221/20; Y02E 10/50
See application file for complete search history.

(56) References Cited

U.S. PATENT DOCUMENTS

| | | | |
|---|---|---|---|
| 3,366,164 A | | 1/1968 | Newton |
| 4,174,064 A | * | 11/1979 | Pratt, Jr. ............ G05D 23/1905 236/1 B |
| 4,733,504 A | | 3/1988 | Lindgren |
| 5,732,517 A | | 3/1998 | Milikovsky |
| 5,852,284 A | | 12/1998 | Teder et al. |
| 6,860,322 B1 | | 3/2005 | Rylewski |
| 2004/0177623 A1 | | 9/2004 | Zelissen et al. |
| 2005/0166495 A1 | | 8/2005 | Cho et al. |
| 2007/0188990 A1 | * | 8/2007 | Wallace ............. H05K 7/20418 361/688 |
| 2008/0236654 A1 | * | 10/2008 | Pietrangelo ............... E06B 3/68 136/251 |
| 2009/0277108 A1 | * | 11/2009 | Hay, III .................... E06B 9/02 52/204.62 |
| 2011/0056924 A1 | | 3/2011 | Townsend |
| 2011/0100591 A1 | | 5/2011 | Garcia |
| 2011/0116155 A1 | * | 5/2011 | Park ....................... C03C 17/23 359/288 |
| 2013/0158790 A1 | * | 6/2013 | McIntyre, Jr. .......... G02F 1/163 701/36 |
| 2013/0167556 A1 | * | 7/2013 | Jun ......................... F25B 21/04 62/3.61 |

FOREIGN PATENT DOCUMENTS

| | | |
|---|---|---|
| DE | 35 41 645 | 6/1987 |
| DE | 38 01 989 | 7/1989 |
| DE | 39 43 516 | 11/1990 |
| DE | 298 12 875 | 11/1998 |
| DE | 197 51 255 | 5/1999 |
| DE | 198 34 997 | 2/2000 |
| DE | 198 24 801 | 4/2000 |
| DE | 299 17 647 | 7/2000 |
| DE | 103 41 169 | 4/2005 |
| DE | 10 2005 036 492 | 3/2006 |
| DE | 20 2006 005 974 | 6/2006 |
| DE | 20 2008 000 678 | 5/2009 |
| DE | 10 2009 007 598 | 8/2009 |
| DE | 10 2010 010 491 | 9/2011 |
| EP | 0 028 820 | 5/1981 |
| EP | 0 078 932 | 5/1983 |
| EP | 0 813 032 | 12/1997 |
| EP | 0 842 382 | 5/1998 |
| EP | 1 216 388 | 6/2002 |
| EP | 1 486 637 | 12/2004 |
| FR | 2 769 786 | 4/1999 |
| FR | 2 816 042 | 5/2005 |
| GB | 1 169 556 | 11/1969 |
| GB | 2 241 378 | 8/1991 |
| GB | 2 424 059 | 9/2006 |
| JP | 2000101116 | 4/2000 |
| JP | 2001132193 | 5/2001 |
| JP | 2002081274 | 3/2002 |
| JP | 2002129846 | 5/2002 |
| WO | 2005111517 | 11/2005 |
| WO | 2008000084 | 1/2008 |
| WO | 2011048595 | 4/2011 |
| WO | 2011126547 | 10/2011 |

OTHER PUBLICATIONS

Schott Solar GmbH, brochure "ASI Glas, Integrated Architecture Powered by the Sun", 2008.
Glass on Web, Solar Facade From Schott Iberica Recognized, www.glassonweb.com/news/index/5092, Nov. 14, 2006.
Schott AG, brochure "Schott ASI Glas—Modular Sizes", 2009.

* cited by examiner

DEVICE FOR HEATING AND/OR COOLING A CHAMBER

The invention relates to a device for heating and/or cooling a room.

From the prior art, it is known that a room, such as a room in a building, can be cooled and/or heated by means of an air conditioner. A desired temperature in the room may be adjusted by means of a control unit. The air conditioning system cools or heats the room so that the desired temperature is reached in the room.

Providing a room in a building with at least one window so that the room can be illuminated with natural light is also known from the prior art.

A glass structure for a building is known from JP 2002129846 A. Further, it is learned from this document that a Peltier element is arranged in a frame of a window. In a double-glazed window, the Peltier element has a line which communicates with an air layer of the double glazing. The air is thus cooled.

Further, a building component for a window is known from JP 2001132193, wherein a Peltier module for cooling is provided which is arranged in an isolating space between two plates.

The above-described prior art has the disadvantage that the known systems are not autonomous systems. The known systems are operated with supply units supplied with power from utility companies. In addition, concerns have arisen that the cooling or heat output of the known systems may possibly not be sufficient to sufficiently cool or heat a room.

The invention is based on the problem of providing a device for heating and/or cooling a room that, on the one hand, can be operated autonomously and that, on the other hand, provides sufficient cooling and heating.

This problem is solved according to the invention with a device having the features of claim 1. A light entry system according to the invention, for example a window system, is given by means of the features of claim 15. Further features of the invention will become apparent from the following description, the attached claims and/or the accompanying figures.

The device according to the invention for heating and/or cooling a room is designed in particular as a window mechanism, for example as a window mechanism for a room in a building, however, it is explicitly noted that the use of the device according to the invention is not restricted to buildings. Rather, the device according to the invention is suitable for heating and/or cooling any space, such as an interior of a motor vehicle, an interior of a train or an interior of a ship. The device according to the invention has at least one frame which is disposed for example on a building for mounting a window. Further, the device according to the invention has at least one first light transmitting means and at least one second light transmitting means. As explained below, the first light transmitting means and/or the second light transmitting means is/are designed as a window(s). The invention is also not limited to two light transmitting means. Rather, any suitable number of light transmitting means may be provided according to the invention.

The first light transmitting means and the second light transmitting means are arranged on the frame. At least one first intermediate space is formed between the first light transmitting means and the second light transmitting means. At least one thermally conductive medium, for example a gas, is arranged in this first intermediate space. This is discussed in greater detail below. At least one heating and/or cooling element of the device according to the invention is now arranged on the frame so that it is in contact with the thermally conductive medium arranged in the intermediate space. In addition, the device comprises at least one power supply unit powered by solar power, which is connected to the heating and/or cooling element.

Due to the solar-powered power supply unit, it is possible for the device to be operated autonomously so that power supplied by a power company is not absolutely necessary. Furthermore, the operation of the device according to the invention is environmentally friendly. In addition, it has surprisingly been shown that the device according to the invention provides a good and sufficient cooling and heating output. The heating and/or cooling element works together with the thermally conductive medium. Such good heat exchange is provided between the heating and/or cooling element and the thermally conductive medium that a room is sufficiently well cooled or heated by the thermally conductive medium. For example, the room is disposed on a first side of the first light transmitting means. The thermally conductive medium is arranged, for example, on a second side of the first light transmitting means and/or flows along it. There is a heat exchange between the thermally conductive medium, the first light transmitting means and the room.

In a further embodiment of the invention, it is additionally or alternatively provided that the power supply unit is provided with power from a power company. In this embodiment, therefore, solar power is not necessarily provided for the operation of the power supply unit. This may be provided in all exemplary embodiments discussed here.

In a further embodiment, it is provided that the device according to the invention additionally or alternatively has at least a third light transmitting means, for example a window. This is further explained below. The third light transmitting means is arranged on the frame. In addition, at least a second intermediate space is formed between the third light transmitting means and the second light transmitting means. In the second intermediate space at least one insulating medium is arranged which reduces heat conduction between the third light transmitting means and the second light transmitting means. As a result, undesirable cooling or heating of a room is reduced. Please refer to the additional description below. Additionally or alternatively, to reduce heat radiation, it is provided that at least one coating is disposed on the third light transmitting means and/or on the second light transmitting means. For example, a first coating is disposed on the side of the third light transmitting means facing the second intermediate space. In addition, a second coating is arranged, for example, on the side of the second light transmitting means facing the second intermediate space. Gold or platinum, for example, is provided as a material for at least one of the above-mentioned coatings. However, the invention is not limited to these materials; rather, any suitable material may be used. At least one of the above coatings is provided, for example, to reflect a specific wavelength or a specific wavelength range of the light entering the room, for example. By way of example, the mid-infrared range of the light is reflected. Light of specified wave lengths or of a specified wavelength range is reflected by the first coating such that it does not reach the second intermediate space. In addition, light of the specified wavelength or of a specified wavelength range is reflected by the second coating such that it does not reach the first intermediate space. However, sufficient heat exchange occurs across the thermally conductive medium between the first light transmitting means and a room to ensure that heating and/or cooling is provided that is sufficient for the room.

In one embodiment of the device according to the invention, it is additionally or alternatively provided that the power supply unit comprises at least one solar unit. For example, the solar unit is designed as a photovoltaic device having at least one solar cell or a number of solar cells. For this purpose, the arrangement of the solar unit is arbitrarily selected. For example, the solar unit may be mounted on the frame of the device according to the invention. Another exemplary embodiment provides for the solar unit to be arranged on the roof of a building where the device according to the invention is located. Further possible exemplary embodiments are described below.

Thus, in a further embodiment of the device according to the invention, it is provided that, additionally or alternatively, the solar unit is disposed on the third light transmitting means. For example, it is envisaged that the third light transmitting means has at least one first side and at least one second side, the first side being adjacent to the second intermediate space, the second side not being adjacent to the second intermediate space and the solar unit being arranged on the first side. In particular, it is provided that the solar unit is designed as a film disposed on the third light transmitting means or on the first side of the third light transmitting means. This may be accomplished, for example, by gluing on the sheet-like solar unit. In yet another exemplary embodiment, it is provided that the solar unit is at least partially transparent. The advantage of this is that a room adjoining the device according to the invention will be sufficiently well illuminated with light, such as sunlight. It is explicitly noted that the invention is not limited to the above-mentioned embodiments of the solar unit. Rather, any suitable solar unit may be used. Further exemplary embodiments of the invention provide for the solar unit to be arranged on the second side of the third light transmitting means.

In yet another embodiment of the device according to the invention, it is provided additionally or alternatively that the solar unit is arranged on the second light transmitting means. For example, it is provided that the second light transmitting means has at least one third side and at least one fourth side, the third side being adjacent to the first intermediate space and the fourth side being not adjacent to the first intermediate space. The solar unit is arranged on the fourth side. In particular, it is envisioned that the solar unit is designed as a film which is disposed on the third light transmitting means or on the fourth side of the third light transmitting means. This is accomplished, for example, by gluing on the sheet-like solar unit. In yet another exemplary embodiment, it is provided that the solar unit is at least partially transparent. Here again, the advantage of this is that a room adjoining the device according to the invention is sufficiently well illuminated with light, such as sunlight. It is also explicitly noted that the invention is not limited to the above-mentioned embodiments of the solar unit. Rather, any suitable solar unit may be used. Further exemplary embodiments of the invention also provide for the solar unit to be arranged on the third side of the second light transmitting means.

It is explicitly noted that the solar unit may also be arranged on the sides of the light transmitting means facing an intermediate space.

In still another embodiment of the device according to the invention, it is additionally or alternatively provided that the solar unit is arranged in the first intermediate space. Alternatively or additionally, it is provided that the solar unit is disposed in the second intermediate space. For example, several solar units are arranged on the device according to the invention. In one embodiment of the device according to the invention, the solar unit is a first solar unit. Furthermore, the device according to the invention has at least one second solar unit. The first solar unit and the second solar unit are spaced apart from each other in the second intermediate space in such a way that at least a third intermediate space is formed between the first solar unit and the second solar unit. Light enters the third intermediate space and then hits the first solar unit and/or the second solar unit. In this embodiment, the first solar unit and/or the second solar unit are designed as plate-like units. In the third intermediate space, an optical unit (e.g., a glass), for example, is arranged so that natural light, for example, which enters the device according to the invention is passed from the optical unit in the direction of the first solar unit and/or in the direction of the second solar unit. This embodiment ensures particularly good transparency of the device. A person in a room that is equipped with this embodiment of the device according to the invention will have the impression that the room is always sufficiently illuminated with daylight. Furthermore, the transparency of the device according to the invention is good enough for the person to have a good view of the surroundings through the device according to the invention.

In one embodiment of the device according to the invention, it is additionally or alternatively provided that at least one limit is arranged between the frame and the first intermediate space on which the frame adjoins the first space. Further, the heating and/or cooling element is connected to at least one cooling unit which projects into the first intermediate space. For example, the cooling unit comprises a cooling fin or a number of cooling fins, for example up to six cooling fins. The invention is not limited to a certain number of cooling fins. Rather, the invention may provide for any number of cooling fins. Further, this embodiment provides, for example, that the heating and/or cooling element is arranged on the frame so that the heating and/or cooling element does not touch the limit. This embodiment has the advantage that the heating and/or cooling element is not visible to an observer. For all intents and purposes, it is recessed in the frame.

In a still further embodiment of the device according to the invention, it is additionally or alternatively provided that the heating and/or cooling element is designed as a Peltier element. The invention is not limited to such a heating and/or cooling element, however. Rather, any suitable heating and/or cooling element may be used in the invention.

In still another embodiment of the device according to the invention, it is additionally or alternatively provided that the frame is designed as a partial frame. In this context, a partial frame is understood to be a frame that is not self-contained. For example, a partial frame in side view is U-shaped. In an alternative embodiment, it is provided that the frame is a full frame. In this case, a full frame in side-view has the shape of a rectangle or a square.

In one embodiment of the device according to the invention, it is additionally or alternatively provided in that the device has at least one of the following features:
the heat conducting medium is a gas
the heat conducting medium is helium, or
the heat conducting medium is hydrogen.

Helium and hydrogen have a significantly higher thermal conductivity than air. The use of helium as a heat conducting medium is preferred, however.

In another embodiment of the device according to the invention, it is additionally or alternatively provided that the device comprises at least one of the following features:
the insulating medium is a gas
the insulating medium is argon or
the insulating medium is krypton.

It is explicitly stressed that the invention is not limited to the aforementioned exemplary embodiments of an insulating medium. Rather, any suitable insulating medium may be used in the invention, for example air. In further exemplary embodiments, the first intermediate space and/or the second intermediate space is maintained under vacuum.

In still another embodiment of the device according to the invention, it is provided that the device additionally or alternatively has at least one of the following features:
- the first light transmitting means is designed as a window,
- the first light transmitting means is a window made of glass,
- the first light transmitting means is a window made of plastic,
- the second light transmitting means is designed as a window.
- the second light transmitting means is a window made of glass, or
- the second light transmitting means a window made of plastic.

In addition, in a further embodiment of the device according to the invention it is provided that the device additionally or alternatively has at least one of the following features:
- the third light transmitting means is designed as a window,
- the third light transmitting means is a window made of glass, or
- the third light transmitting means is a window made of plastic.

In another exemplary embodiment of the device according to the invention, it is additionally or alternatively provided that multiple solar units are used. For example, at least two solar units are provided, for example more than three solar units. The solar units are arranged on at least one of the aforementioned light transmitting means. It is provided for example that any two of the plurality of solar units are spaced apart from each other. This makes it possible, for example, for sunlight to pass unhindered through the intermediate space between two of the plurality of solar units. In yet a further exemplary embodiment, it is additionally or alternatively provided that at least one of the aforementioned light transmitting means is covered up to 100%, or up to 90%, or up to 80%, or up to 70%, or up to 60%, or up to 50%, or up to 40% or up to 30%, or up to 20% or up to 10% with at least one solar unit or with a plurality of solar units, for example, with two solar units. Thus, some areas of the light transmitting means are not covered by solar units, so that in these areas, for example, daylight enters unobstructed into the device according to the invention and can then enter a room.

The invention also relates to a light entry system, particularly a system which is constructed as a window device (window system). This has at least one device having one of the features mentioned above or mentioned further below or a combination of at least two of the characteristics mentioned above or further below.

The invention is now explained in greater detail with reference to exemplary embodiments using the figures.

The invention is described below with reference to exemplary embodiments used for heating and/or cooling a room in a building. The exemplary embodiments are arranged on window systems. However, as mentioned above, the use of the device according to the invention is not limited to buildings. Rather, the device according to the invention is suitable for heating and/or cooling any space, for example, an interior of a motor vehicle, an interior of a train or an interior of a ship.

Figure 1:
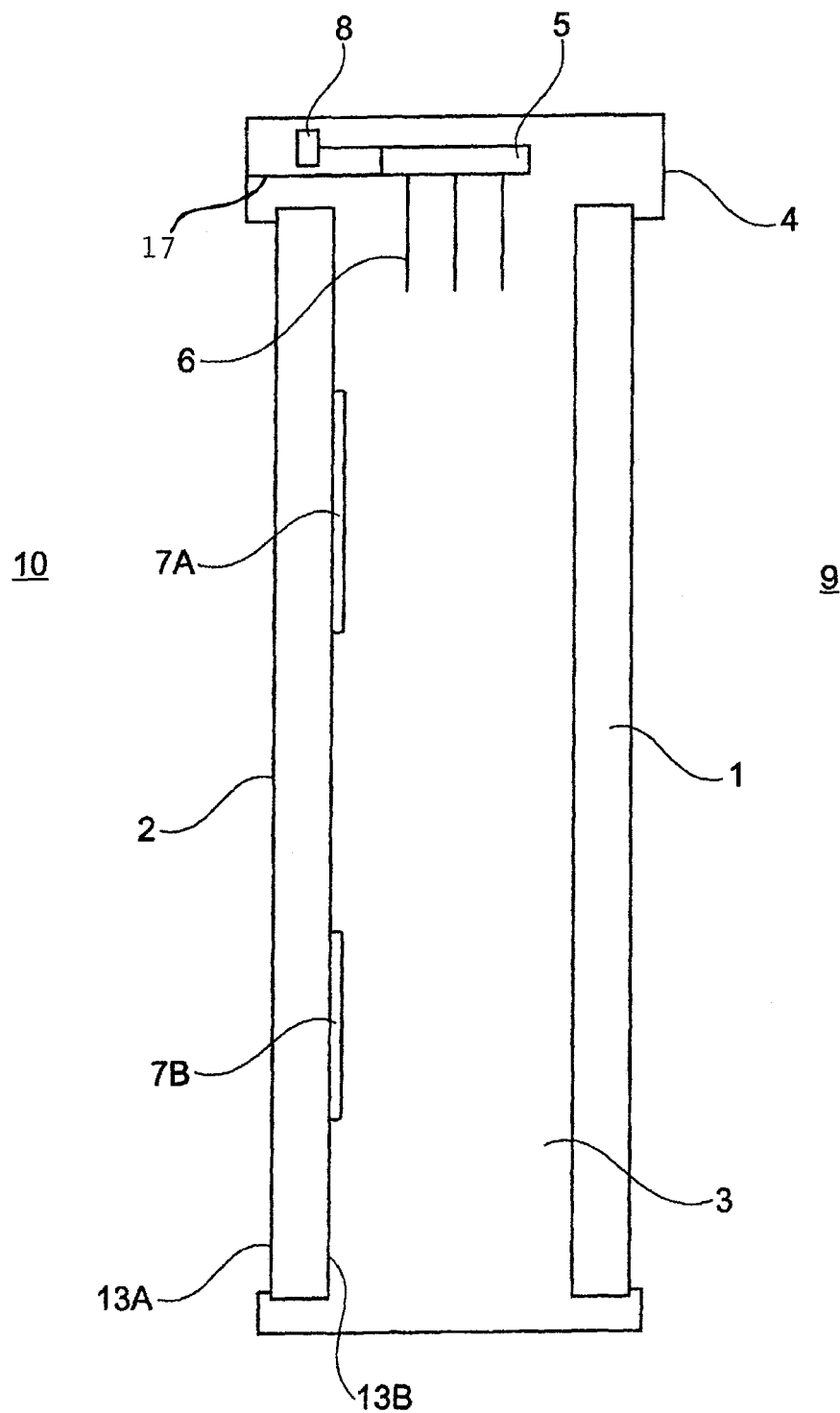
FIG. 1 shows a first embodiment of a device according to the invention for heating and/or cooling a room.

FIG. 1 shows a first exemplary embodiment of the device according to the invention. This is designed as a window system for a room 9 and is secured to a wall of a building (not shown). The window system allows the surroundings 10 to be viewed from the room 9.

The device according to the invention has a first light transmitting means in the form of a first window 1 and a second light transmitting means in the form of a second window 2. For example, the first window 1 and/or the second window 2 is/are made of glass or plastic. The first window 1 and the second window 2 are arranged on a frame 4 such that the first window 1 and the second window 2 are spaced apart from each other. Between the first window 1 and the second window 2, a first intermediate space 3 is formed. The first intermediate space 3 is sealed by the frame 4. A heat conducting medium, for example a gas, is provided in the first intermediate space 3. In the exemplary embodiment shown here, helium is used as a thermally conductive medium. Alternatively, any other suitable gas may also be used.

A heating and a cooling element in the form of a Peltier element 5 is arranged in a recess in the frame 4. The Peltier element 5 is arranged in the frame 4 such that it is not visible to an observer in the room 9. The Peltier element 5 is attached to cooling ribs 6 which project into the first intermediate space 3 and are in contact with the thermally conductive medium.

The second window 2 has an outer side 13A and an inner side 13B, the inner side 13B being adjacent to the first intermediate space 3. A first solar unit 7A and a second solar unit 7B are arranged on the inner side 13B. For example, the first solar unit 7A and the second solar unit 7B are foil-like and mounted on the inner side 13B. It is explicitly noted that the first solar unit 7A and/or the second solar unit 7B is/are not limited to a foil-like design. Rather, any suitable design of the solar units may be used. See above.

Both the first solar unit 7A and the second solar unit 7B are connected to a control and monitoring unit 8. Light from the surroundings 10 falling on the first solar unit 7A and the second solar unit 7B is converted into electricity and passed on to the control and monitoring unit 8. The Peltier element 5 is operated with the power obtained in this way.

Because of the solar-powered power supply unit in the form of the control and monitoring unit 8, it is possible for the device according to the invention to be operated autonomously and to be environmentally friendly. It has also been shown that the device according to the invention surprisingly provides good and sufficient cooling and heating output. The Peltier element 5 works together with the thermally conductive medium in the form of helium. There is good heat exchange between the Peltier element 5 and the helium. The room 9 disposed on the first window 1 is sufficiently well cooled or heated because of the heat exchange between the helium disposed at the first window 1 and/or flowing along it and the first window 1. There is thus a heat exchange between the helium, the first window 1 and the room 9.

The Peltier element 5 is mounted on the frame 4 by means of a conducting plate 16 made of aluminum, for example, such that there is a heat exchange between the Peltier element 5, the conducting plate 17, the frame 4 and the surroundings 10. The heat transported by the described process of heat exchange between the room 9, the first window 1, the helium and the Peltier element 5 is thus again released into the surroundings 10.

Figure 2:
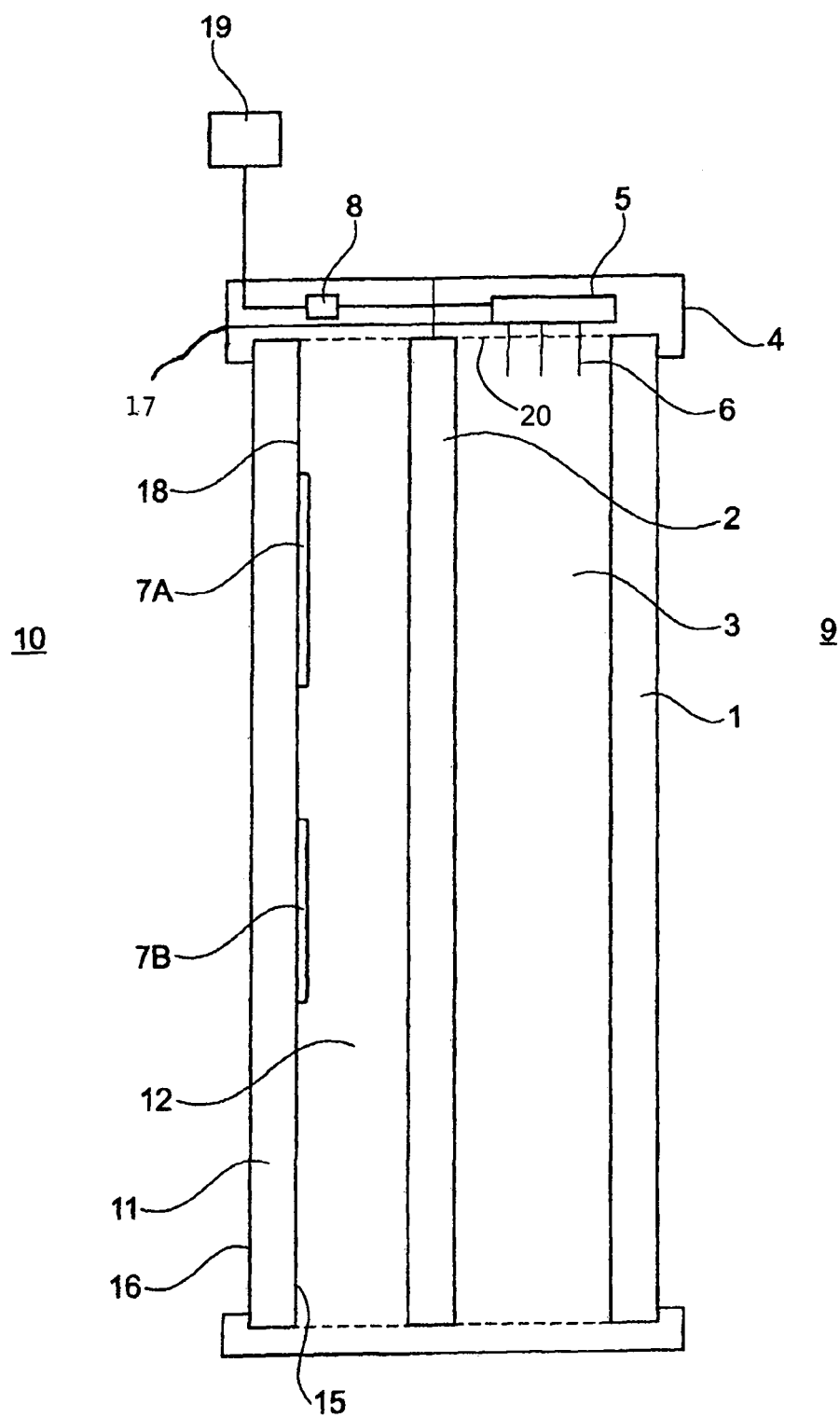
FIG. 2 shows a second embodiment of a device according to the invention for heating and/or cooling a room.

The exemplary embodiment of FIG. 2 is based on the exemplary embodiment according to FIG. 1. The same components are thus provided with the same reference numerals. Unlike the exemplary embodiment according to FIG. 1, the exemplary embodiment according to FIG. 2 is different in that a third light transmitting means in the form of a third window 11 is arranged on the frame 4. A second intermediate space 12 is formed between the second window 2 and the third window 11. The second intermediate space 12 is sealed by the frame 4. An insulating medium, such as a gas, is disposed in the second intermediate space 12. In the exemplary embodiment shown here, argon or krypton is used as the insulating medium. Alternatively, any other suitable gas can also be used, for example air. Also, the second intermediate space 12 can be placed under vacuum.

The third window 11 has a first side 15 and a second side 16. The first side 15 faces toward the second intermediate space 12. In contrast, the second side 16 faces the outdoor surroundings 10. The first solar unit 7A and the second solar unit 7B are arranged on the first side 15.

In this embodiment, the insulating medium used in the second intermediate space 12 serves to reduce thermal conductivity between the second window 2 and the third window 11. For example, heat produced by the incidence of light on the first solar unit 7A or on the second solar unit 7B is reduced as it moves to the second window 2. In addition or alternatively, it is provided that at least one coating is disposed on the third window 11 and/or on the second window 2 to reduce heat radiation. As explained above, for example, a first coating 18 is disposed on the first side 15 of the third window 11 facing the second intermediate space 12. Furthermore, a second coating (not shown), for example, is disposed on the side of the second window 2 facing the second intermediate space 12. Gold or platinum, for example, is provided as a material for coating. The invention is not limited to these materials; rather, any suitable material may be used. At least one of the above coatings, for example, is provided to reflect light of a specific wavelength or a specific wavelength range, for example. For example, the mid-infrared portion of the light is reflected (a range with wavelengths of 3 µm to 50 µm, in particular).

The helium in the first intermediate space 3 ensures that sufficient heat exchange to create sufficient cooling or heating of the room 9 takes place between the first window 1 and the room 9.

Figure 3:
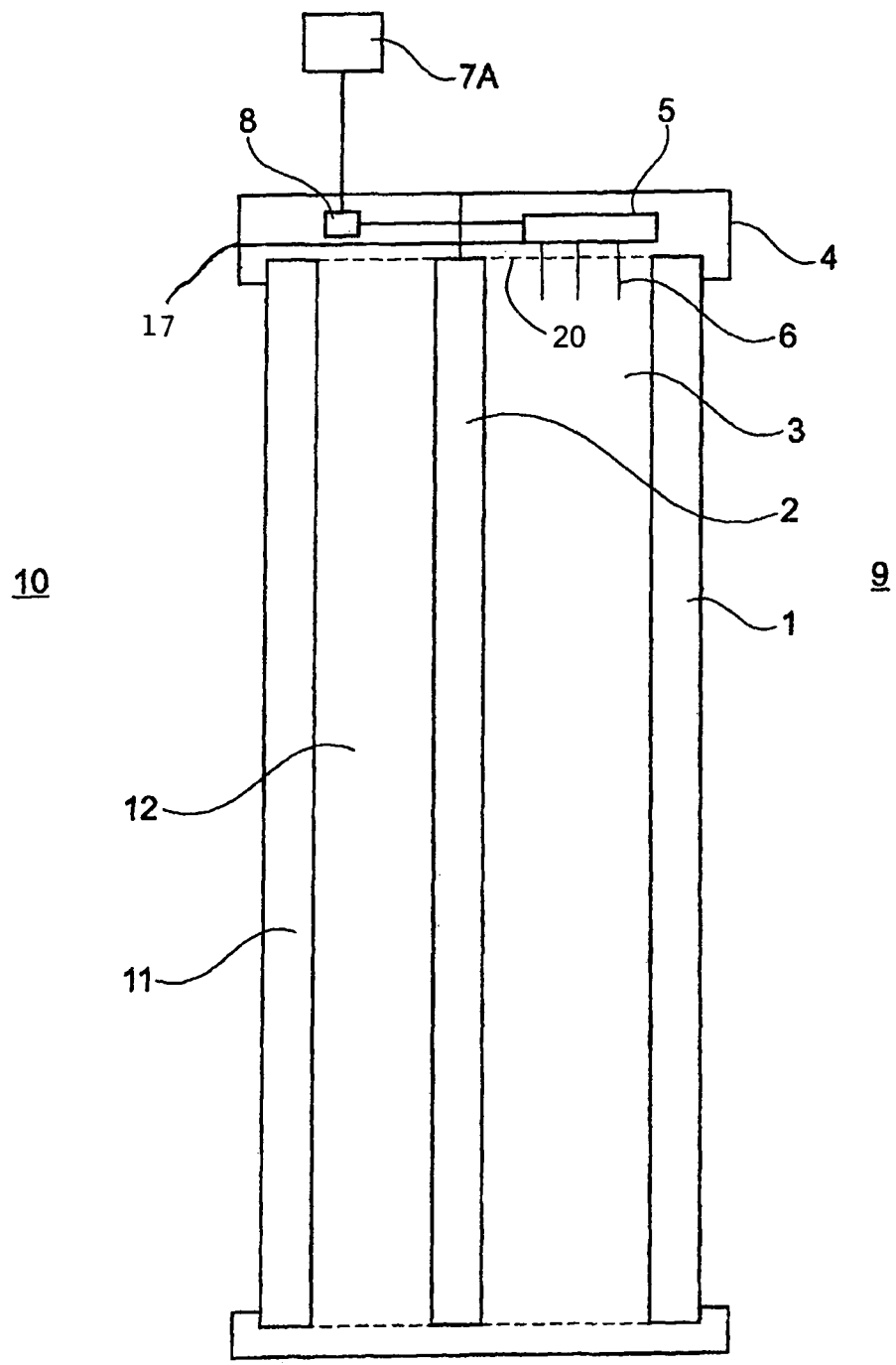
FIG. 3 shows a third embodiment of a device according to the invention for heating and/or cooling a room.

The exemplary embodiment of FIG. 3 is based on the exemplary embodiment according to FIG. 2. The same components are therefore provided with the same reference numerals. In contrast to exemplary embodiment according to FIG. 2, exemplary embodiment according to FIG. 3 is different in that the first solar unit 7A is arranged in a different location than the other units of the device according to the invention, for example, on the roof of the building.

Figure 4:
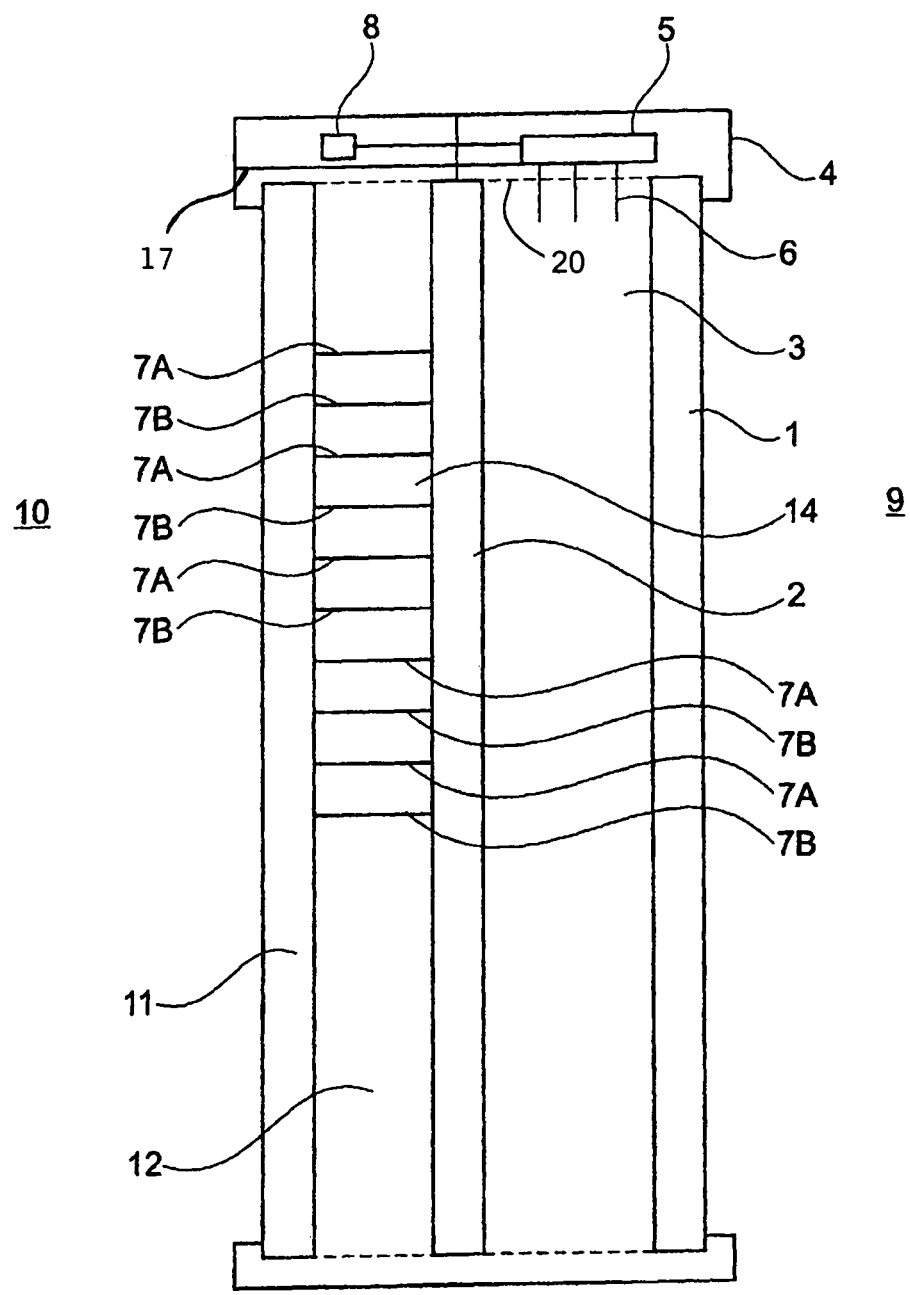
FIG. 4 shows a fourth embodiment of a device according to the invention for heating and/or cooling a room.

The exemplary embodiment of FIG. 4 is also based on the exemplary embodiment according to FIG. 2. The same components are therefore provided with the same reference numerals. In contrast to the exemplary embodiment according to FIG. 2, the exemplary embodiment according to FIG. 4 is different in that a plurality of first solar units 7A and a plurality of second solar units 7B are provided. The plurality of first solar units 7A and the plurality of second solar units 7B are designed to be plate-like. They have a thickness of 0.5 mm to 2 cm, for example. Furthermore, a first solar unit 7A and a second solar unit 7B are spaced apart in the second intermediate space 12 at a distance from one another such that at least a third intermediate space 14 is formed between the first solar unit 7A and the second solar unit 7B. Light enters the third intermediate space 14 and then falls on the first solar unit 7A and/or on the second solar unit 7B. In the third intermediate space 14, for example, an optical unit (e.g., a glass) is arranged so that natural light from the surroundings entering the device according to the invention is passed from the optical unit to the first solar unit 7A and/or to the second solar unit 7B. As mentioned above, this embodiment ensures a particularly good transparency of the device.

Each of the embodiments described herein may include an operating unit. By way of example, this is indicated in FIG. 2 by the reference numeral 19. It should be noted that every other exemplary embodiment described herein may also have the operating unit 19. The device according to the invention is controlled by means of the operating unit 19. For example, the cooling or heating of the room 9 is adjusted by the operating unit 19. The operating unit 19 is designed such that the temperature of the room 9 can be controlled, for example. The temperature of the room 9 is measured with appropriate sensors. Once the temperature of the room 9 falls below or rises above a value set by means of the operating unit 19, the device according to the invention is controlled so that the set temperature in the room 9 is reached by cooling or heating. In a further embodiment of the invention, the operating unit 19 comprises a remote control.

LIST OF REFERENCE NUMBERS 1 first window
2 second window
3 first intermediate space
4 frame
5 Peltier element
6 cooling fins
7A first solar unit
7B second solar unit
8 control and monitoring unit (power supply unit)
9 room
10 surroundings
11 third window
12 second intermediate space
13A outer side
13B inner side
14 third intermediate space
15 first side
16 second side
17 conducting plate
18 first coating
19 control unit

The invention claimed is:

1. A device, in particular a window device for heating or cooling a room (9), comprising:
   at least one frame (4),
   at least one first light transmitting means (1),
   at least one second light transmitting means (2),
   at least one heating or cooling element (5),
   at least one thermally conductive medium; and
   at least one solar-powered power supply unit (8) electrically connected to the heating or cooling element (5); and
   a sensor configured to measure a temperature of the room; and
   an operating unit configured to receive an indication of the temperature, and provide instructions so that the heating or cooling element removes heat from the thermally conductive medium when the indication indicates the temperature is above a desired value, and adds heat to the thermally conductive medium when the indication indicates the temperature is below a desired value, so that the room is cooled or heated via heat exchange between the thermally conductive medium, the first light transmitting means, and the room;
in which
the first light transmitting means (1) and the second light transmitting means (2) are arranged on the frame (4) to:
(a) form a window through which surroundings may be viewed from the room; and
(b) form at least one first intermediate space (3) between the first light transmitting means (1) and the second light transmitting means (2),
the at least one thermally conductive medium is arranged in the first intermediate space (3),
the at least one heating or cooling element (5) is arranged on the frame (4) such that the at least one heating or cooling element (5) is in contact with the thermally conductive medium and configured to remove heat from the thermally conductive medium and to add heat to the thermally conductive medium according to the instructions from the operating unit.

2. The device according to claim 1, further comprising:
at least one third light transmitting means (11), that is arranged on the frame (4) to form at least one second intermediate space (12) between the third light transmitting means (11) and the second light transmitting means (2), and
at least one insulating medium arranged in the second intermediate space (12).

3. The device according to claim 2, wherein the solar powered power supply unit (8) comprises at least one solar unit (7A, 7B).

4. The device according to claim 3, wherein the at least one solar unit (7A, 7B) is arranged on the third light transmitting means (11).

5. The device according to claim 3, wherein the at least one solar unit (7A, 7B) is arranged on the second light transmitting means (2).

6. The device according to claim 3, wherein the at least one solar unit (7A, 7B) is arranged in the first intermediate space (3).

7. The device according to claim 3, wherein the at least one solar unit (7A, 7B) is arranged in the second intermediate space (12).

8. The device according to claim 7, wherein:
the at least one solar unit (7A) comprises a first solar unit and a second solar unit,
the first solar unit (7A) and the second solar unit (7B) are arranged in the second intermediate space (12) at such a distance from one another that at least a third intermediate space (14) is formed between the first solar unit (7A) and the second solar unit (7B) such that light comes through the third intermediate space (14) and falls on the first solar unit (7A) and/or on the second solar unit (7B).

9. The device according to claim 1, wherein:
between the frame (4) and the first intermediate space (3), at least one limit is arranged at which the frame (4) adjoins the first intermediate space (3),
the heating or cooling element (5) is connected to at least one cooling unit (6) which projects into the first intermediate space (3), and wherein the heating or cooling element (5) is arranged on the frame (4) in such a manner that the heating or cooling element (5) does not touch the limit.

10. The device according to claim 1, wherein the heating or cooling element is designed as a Peltier element (5).

11. The device according to claim 1, wherein the thermally conductive medium is in the form of a gas.

12. The device according to claim 2, wherein the insulating medium is in the form of a gas.

13. The device according to claim 1, wherein the first light transmitting means (1) is a window.

14. The device according to claim 2, wherein the third light transmitting means (11) is a window.

15. A window system, comprising:
at least one frame (4),
at least one first light transmitting means (1),
at least one second light transmitting means (2),
at least one heating or cooling element (5),
at least one thermally conductive medium; and
at least one solar-powered power supply unit (8) connected to the heating or cooling element(5); and
a sensor configured to measure a temperature of a room; and
an operating unit configured to receive an indication of the temperature, and provide instructions so that the heating or cooling element removes heat from the thermally conductive medium when the indication indicates the temperature is above a desired value, and adds heat to the thermally conductive medium when the indication indicates the temperature is below a desired value, so that the room is cooled or heated via heat exchange between the thermally conductive medium, the first light transmitting means, and the room;
in which
the first light transmitting means (1) and the second light transmitting means (2) are arranged on the frame (4) to:
(a) form a window through which surroundings may be viewed from the room; and
(b) form at least one first intermediate space (3) between the first light transmitting means (1) and the second light transmitting means (2),
the at least one thermally conductive medium is arranged in the first intermediate space (3), and
the at least one heating or cooling element (5) is arranged on the frame (4) such that the at least one heating or cooling element (5) is in contact with the thermally conductive medium and configured to remove heat from the thermally conductive medium and to add heat to the thermally conductive medium according to the instructions from the operating unit.

16. The device according to claim 3, wherein the third light transmitting means (11) has at least one first side (15) and at least one second side (16), wherein the first side (15) is adjacent to the second intermediate space (12), the second side (16) is not adjacent to the second intermediate space (12), and wherein said at least one solar unit (7A, 7B) is arranged on the first side (15).

17. The device according to claim 3, wherein the at least one solar unit (7A, 7B) is at least partially transparent.

18. The device according to claim 3, wherein the second light transmitting means (2) has at least one third side (13B) and at least one fourth side (13A), wherein the third side (13B) is adjacent to the first intermediate space (3), wherein the fourth side (13A) is not adjacent to the first intermediate space (3), and wherein the at least one solar unit (7A, 7B) is arranged on the fourth side (13A).

19. The device according to claim 3, wherein the at least one solar unit (7A, 7B) is at least partially transparent.

20. The device according to claim 1, wherein the thermally conductive medium is helium.

21. The device according to claim 1, wherein the thermally conductive medium is hydrogen.

22. The device according to claim 2, wherein the insulating medium is argon.

23. The device according to claim 2, wherein the insulating medium is krypton.

24. The device according to claim 1, wherein the first light transmitting means (1) is a window made of glass.

25. The device according to claim 1, wherein the first light transmitting means (1) is a window made of plastic.

26. The device according to claim 1, wherein the second light transmitting means (2) is a window.

27. The device according to claim 1, wherein the second light transmitting means (2) is a window made of glass.

28. The device according to claim 1, wherein the second light transmitting means (2) is a window made of plastic.

29. The device according to claim 2, wherein the third light transmitting means (11) is a window made of glass.

30. The device according to claim 2, wherein the third light transmitting means (11) is, a window made of plastic.

31. A device, in particular a window device for heating or cooling a room (9), namely a room in a building, an interior of a motor vehicle, an interior of a train or an interior of a ship, comprising:
    at least one frame (4),
    at least one first light transmitting means (1),
    at least one second light transmitting means (2),
    at least one heating or cooling element (5),
    at least one thermally conductive medium; and
    at least one solar-powered power supply unit (8) electrically connected to the heating or cooling element (5); and
    a sensor configured to measure a temperature of the room; and
    an operating unit configured to receive an indication of the temperature, and provide instructions so that the heating or cooling element removes heat from the thermally conductive medium when the indication indicates the temperature is above a desired value, and adds heat to the thermally conductive medium when the indication indicates the temperature is below a desired value, so that the room is cooled or heated via heat exchange between the thermally conductive medium, the first light transmitting means, and the room;
in which
    the first light transmitting means (1) and the second light transmitting means (2) are arranged on the frame (4) to:
        (a) form a window through which surroundings may be viewed from the room; and
        (b) form at least one first intermediate space (3) between the first light transmitting means (1) and the second light transmitting means (2),
    the at least one thermally conductive medium is arranged in the first intermediate space (3),
    the at least one heating or cooling element (5) is arranged on the frame (4) such that the at least one heating or cooling element (5) is in contact with the thermally conductive medium for heating or cooling the room, namely the room in the building, the interior of the motor vehicle, the interior of the train or the interior of the ship.

* * * * *